(12) United States Patent
Kanno et al.

(10) Patent No.: US 7,601,909 B2
(45) Date of Patent: Oct. 13, 2009

(54) POWER GENERATION METHOD USING THERMOELECTRIC ELEMENT, THERMOELECTRIC ELEMENT AND FABRICATION METHOD THEREOF, AND THERMOELECTRIC DEVICE

(75) Inventors: Tsutomu Kanno, Osaka (JP); Hideaki Adachi, Osaka (JP); Satoshi Yotsuhashi, Osaka (JP)

(73) Assignee: Panasonic Corporation, Osaka (JP)

( * ) Notice: Subject to any disclaimer, the term of this patent is extended or adjusted under 35 U.S.C. 154(b) by 47 days.

(21) Appl. No.: 12/013,795

(22) Filed: Jan. 14, 2008

(65) Prior Publication Data

US 2008/0173343 A1 Jul. 24, 2008

Related U.S. Application Data

(63) Continuation of application No. PCT/JP2007/063683, filed on Jul. 9, 2007.

(30) Foreign Application Priority Data

Nov. 10, 2006 (JP) .............................. 2006-304732

(51) Int. Cl.
    *H01L 35/12* (2006.01)
(52) U.S. Cl. ....................... 136/205; 136/240
(58) Field of Classification Search ............. 136/205, 136/240
    See application file for complete search history.

(56) References Cited

U.S. PATENT DOCUMENTS

| 5,793,092 | A | 8/1998 | Habermeier et al. |
| 5,922,988 | A | 7/1999 | Nishimoto |
| 6,710,238 | B1 | 3/2004 | Shingu et al. |
| 7,449,628 | B2 * | 11/2008 | Zenitani et al. .......... 136/236.1 |

FOREIGN PATENT DOCUMENTS

| EP | 1193774 A1 * | 4/2002 |
| JP | 6-310766 | 11/1994 |

(Continued)

OTHER PUBLICATIONS

Snarskii, A.A., et al., "Anisotropic Thermoelements", Thermoelectrics Handbook: Macro to Nano, 2006, Chapter 45.1-45.11, CRC Press.

*Primary Examiner*—Jeffrey T. Barton
(74) *Attorney, Agent, or Firm*—McDermott Will & Emery LLP (57) ABSTRACT

The invention provides a power generation method using a thermoelectric element, a thermoelectric element, and a thermoelectric device that excel in thermoelectric performance and are applicable to a wider range of applications over conventional counterparts. The element includes a first electrode and a second electrode that are disposed to oppose each other, and a laminate interposed between the first and second electrodes and electrically connected to both of the electrodes. The laminate has a structure in which a Bi layer and a metal layer made of a metal other than Bi are alternately layered, and the Bi layer and the metal layer having layer surfaces that are slanted with respect to a direction in which the first and second electrodes oppose each other. The element generates a potential difference between the electrodes by a temperature difference created along a direction perpendicular to the opposing direction of the first and second electrodes in the element. The power generation method and the thermoelectric device use this element.

28 Claims, 5 Drawing Sheets

| FOREIGN PATENT DOCUMENTS | | | | | |
|---|---|---|---|---|---|
| JP | 8-247851 | 9/1996 | JP | 2006-319210 | 11/2006 |
| JP | 10-032355 | 2/1998 | WO | WO 00/76006 A1 | 12/2000 |
| JP | 10-70315 | 3/1998 | | | |

* cited by examiner

POWER GENERATION METHOD USING THERMOELECTRIC ELEMENT, THERMOELECTRIC ELEMENT AND FABRICATION METHOD THEREOF, AND THERMOELECTRIC DEVICE

RELATED APPLICATIONS

This Application is a continuation of International Application No. PCT/JP2007/063683, whose international filing date is Jul. 9, 2007, which in turn claims the benefit of Japanese Application No. 2006-304732 filed Nov. 10, 2006, the disclosure of which Applications are incorporated by reference herein. The benefit of the filing and priority dates of the International and Japanese Applications is respectfully requested.

BACKGROUND OF THE INVENTION

1. Field of the Invention

The present invention relates to a power generation method using a thermoelectric element whereby electric energy is directly obtained from thermal energy. The present invention also relates to a thermoelectric element that directly converts thermal energy into electric energy, a fabrication method of the thermoelectric element, and a thermoelectric device.

2. Related Background Art

Thermoelectric generation is a technology for directly converting thermal energy into electric energy using the Seebeck effect, i.e. a phenomenon in which an electromotive force is generated in proportion to a temperature difference created between opposite ends of a substance. This technology has been used practically, for example, for a remote area power supply, a space power supply, and a military power supply.

Conventional thermoelectric elements typically have a configuration known as the "π-type structure," in which a p-type semiconductor and an n-type semiconductor, having carriers of opposite signs, are combined with each other thermally in parallel and electrically in series.

Generally, the performance of a thermoelectric material used for the thermoelectric element is evaluated by a figure of merit Z, or a figure of merit ZT that is obtained by multiplying Z by absolute temperature T to be non-dimensionalized. ZT can be expressed as $ZT=S^2/\rho\kappa$, where S is a Seebeck coefficient, $\rho$ is electrical resistivity, and $\kappa$ is thermal conductivity of the thermoelectric material. The figure $S^2/\rho$, which takes into account only the Seebeck coefficient S and electrical resistivity $\rho$, is called a power factor (output factor) that is used as a measure of evaluating the generating performance of the thermoelectric material under a constant temperature difference.

The thermoelectric material $Bi_2Te_3$ that has been put to practical applications until today has a relatively high thermoelectric performance with a ZT of about 1 and a power factor of 40 to 50 $\mu W/(cm \cdot K^2)$. However, it has been difficult to retain a high thermoelectric performance when the material is used in an element of the π-type structure. As such, the performance of this material is not sufficient for use in a wide range of practical applications.

Meanwhile, as an element having a structure other than the π-type structure, an element has long been proposed that takes advantage of the anisotropy of thermoelectric properties of layered structures found in nature or artificially produced (Thermoelectrics Handbook, Chapter 45 "Anisotropic Thermoelements", CRC Press (2006): Reference 1.) However, as taught in Reference 1, improvement of ZT in this type of element is difficult to achieve, and for this reason developments have been made primarily for measurement applications such as infrared sensors, instead of applications concerning thermoelectric generation.

A thermoelectric material having a similar structure is disclosed in JP 6(1994)-310766 A (Reference 2), in which a material having thermoelectric properties as represented by Fe—Si materials, and an insulating material having a thickness of 100 nm or less as represented by $SiO_2$ are alternately arranged in stripes on a substrate. According to Reference 2, while the material having this kind of microstructure is able to improve in Seebeck coefficient S compared with the sole use of the Fe—Si material having thermoelectric properties, inclusion of the insulating material increases electrical resistivity $\rho$. This leads an element using the material increase its internal resistance with the result that the power is reduced on the contrary.

There is another type of thermoelectric material having a layered structure, as disclosed in, for example, International Publication pamphlet 00/076006 (Reference 3) that teaches a material having a laminar body of a semimetal, a metal, or a synthetic resin. This material is intended for the structure in which, as in the conventional π-type structure, a temperature difference is created along the direction in which the constituting layers of the laminar body are laminated, and power is extracted via a pair of electrodes disposed face to face in this direction. The element disclosed in Reference 3, therefore, fundamentally differs from the element disclosed in Reference 1.

SUMMARY OF THE INVENTION

As described above, the thermoelectric performance of conventional thermoelectric materials is not sufficient for use in a wide range of practical applications. The inventors of the present invention conducted intensive studies on thermoelectric elements that use laminates. The studies led to a surprising finding that the power factor of the element could be increased and the thermoelectric properties greatly improved with the use of a laminate formed of Bi (bismuth) and metal and by slanting the layer surfaces of the laminate with respect to a direction in which the electrodes sandwiching the laminate oppose each other, as compared with the case where a Bi material as represented by $Bi_2Te_3$ is solely used as the thermoelectric material. The present invention was accomplished based on this finding.

Specifically, the present invention provides a power generation method using a thermoelectric element, in which power is obtained from the element by creating a temperature difference in the element. The element includes: a first electrode and a second electrode that are disposed to oppose each other; and a laminate interposed between the first electrode and the second electrode and electrically connected to both of the first and second electrodes. The laminate has a structure in which a Bi layer and a metal layer made of a metal other than Bi are alternately layered, and the Bi layer and the metal layer have layer surfaces that are slanted with respect to a direction in which the first electrode and the second electrode oppose each other. The method includes creating a temperature difference along a direction perpendicular to the opposing direction of the first and second electrodes in the element, so as to obtain power via the first and second electrodes.

The present invention provides a thermoelectric element including: a first electrode and a second electrode that are disposed to oppose each other; and a laminate interposed between the first electrode and the second electrode and electrically connected to both of the first and second electrodes. The laminate has a structure in which a Bi layer and a metal layer made of a metal other than Bi are alternately layered, and the Bi layer and the metal layer have layer surfaces that are slanted with respect to a direction in which the first electrode and the second electrode oppose each other. The element generates a potential difference between the first and second electrodes by a temperature difference created along a direction perpendicular to the opposing direction of the first and second electrodes in the element.

The present invention provides a fabrication method of a thermoelectric element which includes: a first electrode and a second electrode that are disposed to oppose each other; and a laminate interposed between the first electrode and the second electrode and electrically connected to both of the first and second electrodes. The laminate has a structure in which a Bi layer and a metal layer made of a metal other than Bi are alternately layered, and the Bi layer and the metal layer have layer surfaces that are slanted with respect to a direction in which the first electrode and the second electrode oppose each other. The element generates a potential difference between the first electrode and the second electrode by a temperature difference created along a direction perpendicular to the opposing direction of the first and second electrodes in the element. The method includes: cutting an original plate in which the Bi layer and the metal layer made of a metal other than Bi are alternately layered, such that the original plate is cut by obliquely traversing the layer surfaces of the Bi layer and the metal layer; and providing a resulting laminate with the first electrode and the second electrode such that the first and second electrodes oppose each other, and that the opposing direction of the first and second electrodes traverses the layer surfaces of the Bi layer and the metal layer.

The present invention provides a thermoelectric device including: a support plate; and a thermoelectric element disposed on the support plate. The element includes a first electrode and a second electrode that are disposed to oppose each other, and a laminate interposed between the first electrode and the second electrode and electrically connected to both of the first and second electrodes. The laminate has a structure in which a Bi layer and a metal layer made of a metal other than Bi are alternately layered. The Bi layer and the metal layer have layer surfaces that are slanted with respect to the opposing direction of a pair of the first and second electrodes. The element is disposed on the support plate such that a direction perpendicular to the opposing direction of the pair of the electrodes coincides with a direction perpendicular to a surface of the support plate on which the element is disposed. Power can be obtained via the pair of the electrodes by creating a temperature difference along a direction perpendicular to the surface of the support plate.

The present invention provides a power generation method, a thermoelectric element, and a thermoelectric device that realize superior thermoelectric properties over power generation methods, thermoelectric elements, and thermoelectric devices using conventional thermoelectric materials as represented by BiTe$_3$. The present invention improves the efficiency of energy conversion between thermal energy and electric energy, and thereby promotes application of thermoelectric generation to a wide range of fields. The invention is therefore industrially highly useful.

DETAILED DESCRIPTION OF THE INVENTION

In a power generation method of the present invention, the angle (slant angle) θ by which the layer surfaces of a Bi layer and a metal layer in a laminate is slanted with respect to a direction in which a first electrode and a second electrode oppose each other may be 20° or more to 60° or less, or 20° or more to 50° or less.

In a power generation method of the present invention, the metal layer may include Al, Cu, Ag, or Au, and preferably includes Cu, Ag, or Au, and more preferably Cu or Ag.

In a power generation method of the present invention, the thickness ratio of the metal layer and the Bi layer may be in a range of metal layer:Bi layer=40:1 to 5:1, and is preferably in a range of metal layer:Bi layer=20:1 to 10:1.

In a power generation method of the present invention, a thermoelectric element may have a power factor of 70 (μW/(cm·K$^2$)) or more.

In a power generation method of the present invention, the metal layer may include Al, Cu, Ag, or Au, and a thickness ratio of the metal layer and the Bi layer may be in a range of metal layer:Bi layer=40:1 to 5:1.

In a power generation method of the present invention, the metal layer may include Cu or Ag, a thickness ratio of the metal layer and the Bi layer may be in a range of metal layer:Bi layer=20:1 to 10:1, and a power factor of the thermoelectric element may be 70 (μW/(cm·K$^2$)) or more under these conditions.

In a thermoelectric element of the present invention, the angle (slant angle) θ by which the layer surfaces of a Bi layer and a metal layer in a laminate is slanted with respect to a direction in which a first electrode and a second electrode oppose each other may be 20° or more to 60° or less, or 20° or more to 50° or less.

In a thermoelectric element of the present invention, the metal layer may include Al, Cu, Ag, or Au, and preferably includes Cu, Ag, or Au, and more preferably Cu or Ag.

In a thermoelectric element of the present invention, the thickness ratio of the metal layer and the Bi layer may be in a range of metal layer:Bi layer=40:1 to 5:1, and is preferably in a range of metal layer:Bi layer=20:1 to 10:1.

In a thermoelectric element of the present invention, the thermoelectric element may have a power factor of 70 (μW/(cm·K$^2$)) or more.

In a thermoelectric element of the present invention, the metal layer may include Al, Cu, Ag, or Au, and a thickness ratio of the metal layer and the Bi layer may be in a range of metal layer:Bi layer=40:1 to 5:1.

In a thermoelectric element of the present invention, the metal layer may include Cu or Ag, a thickness ratio of the metal layer and the Bi layer may be in a range of metal layer:Bi layer=20:1 to 10:1, and a power factor of the thermoelectric element may be 70 (μW/(cm·K$^2$)) or more under these conditions.

A thermoelectric device of the present invention may have two or more of the thermoelectric elements mentioned above, and the thermoelectric elements may be electrically connected to each other in series via the first or second electrode, or may be electrically connected to each other in parallel via the first or second electrode.

(Thermoelectric Element)

Figure 1:
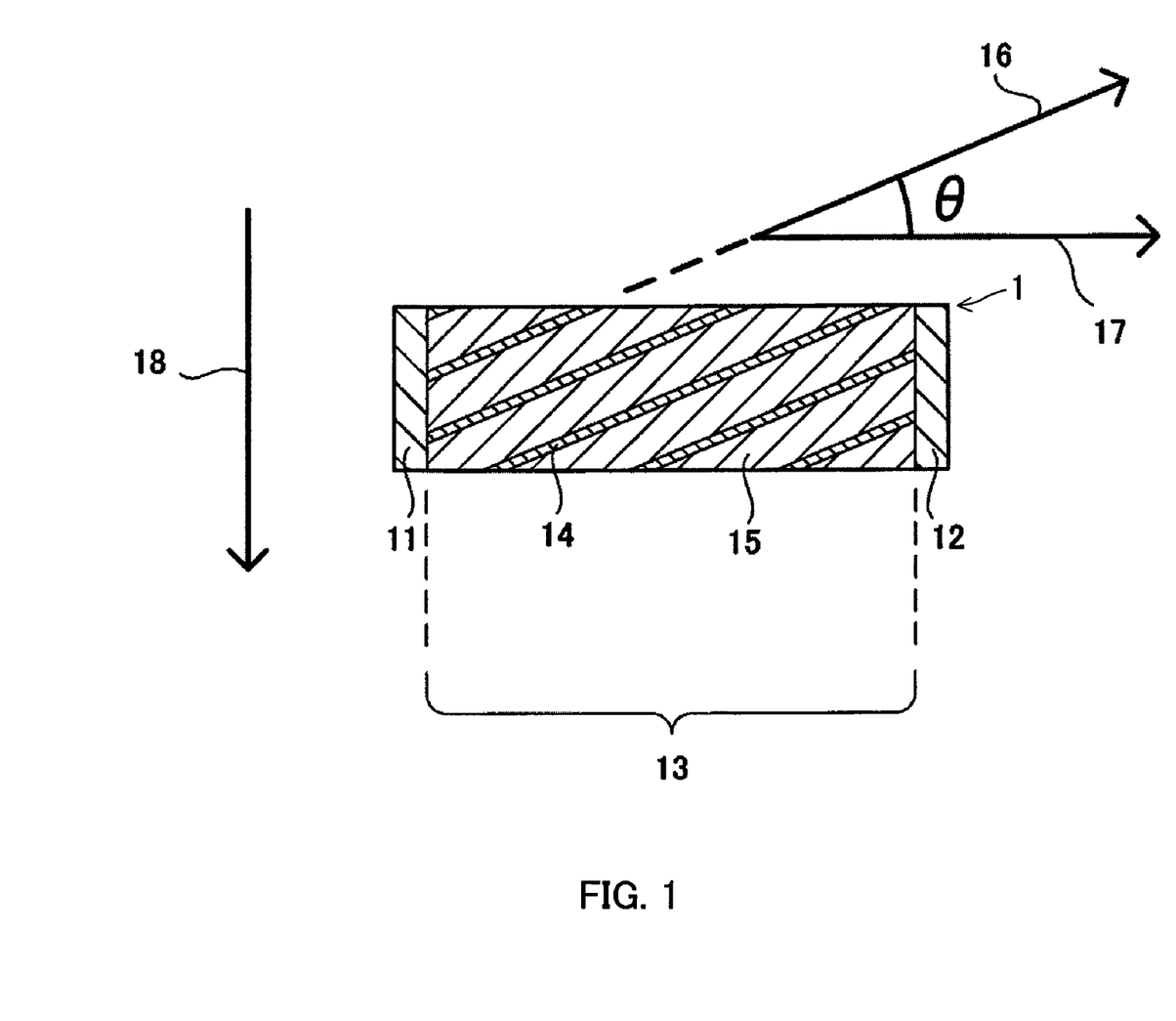
FIG. 1 is a diagram that schematically shows an example of a thermoelectric element of the present invention, together with a direction in which a first electrode and a second electrode oppose each other, a direction along which a temperature difference is created, and a slant angle θ.

FIG. 1 shows an example of a thermoelectric element of the present invention. The thermoelectric element 1 shown in FIG. 1 includes a first electrode 11 and a second electrode 12 that are disposed to oppose each other, and a laminate 13 interposed between the first electrode 11 and the second electrode 12 and electrically connected to both of the electrodes. The laminate 13 is connected to the principal surfaces of the first electrode 11 and the second electrode 12, the principal surfaces being parallel to each other. The laminate 13 shown in FIG. 1 is rectangular in shape, and the first electrode 11 and the second electrode 12 are respectively disposed on surfaces of the laminate 13 at the opposite ends of the laminate 13. The surfaces of the first electrode 11 and the second electrode 12 are orthogonal to the direction in which the first electrode 11 and the second electrode 12 oppose each other (opposing direction 17).

The laminate 13 has an alternately layered structure of a Bi layer 14 and a metal layer 15 made of a metal other than Bi. The layer surface of each layer (direction 16 parallel to the principal surface of each layer) is slanted at slant angle θ with respect to the opposing direction 17.

In the thermoelectric element 1, a potential difference is generated between the first electrode 11 and the second electrode 12 by a temperature difference along direction 18 perpendicular to the opposing direction 17. In other words, by creating a temperature difference along direction 18 perpendicular to the opposing direction 17 in the thermoelectric element 1, power can be extracted via the first electrode 11 and the second electrode 12.

Figure 2:
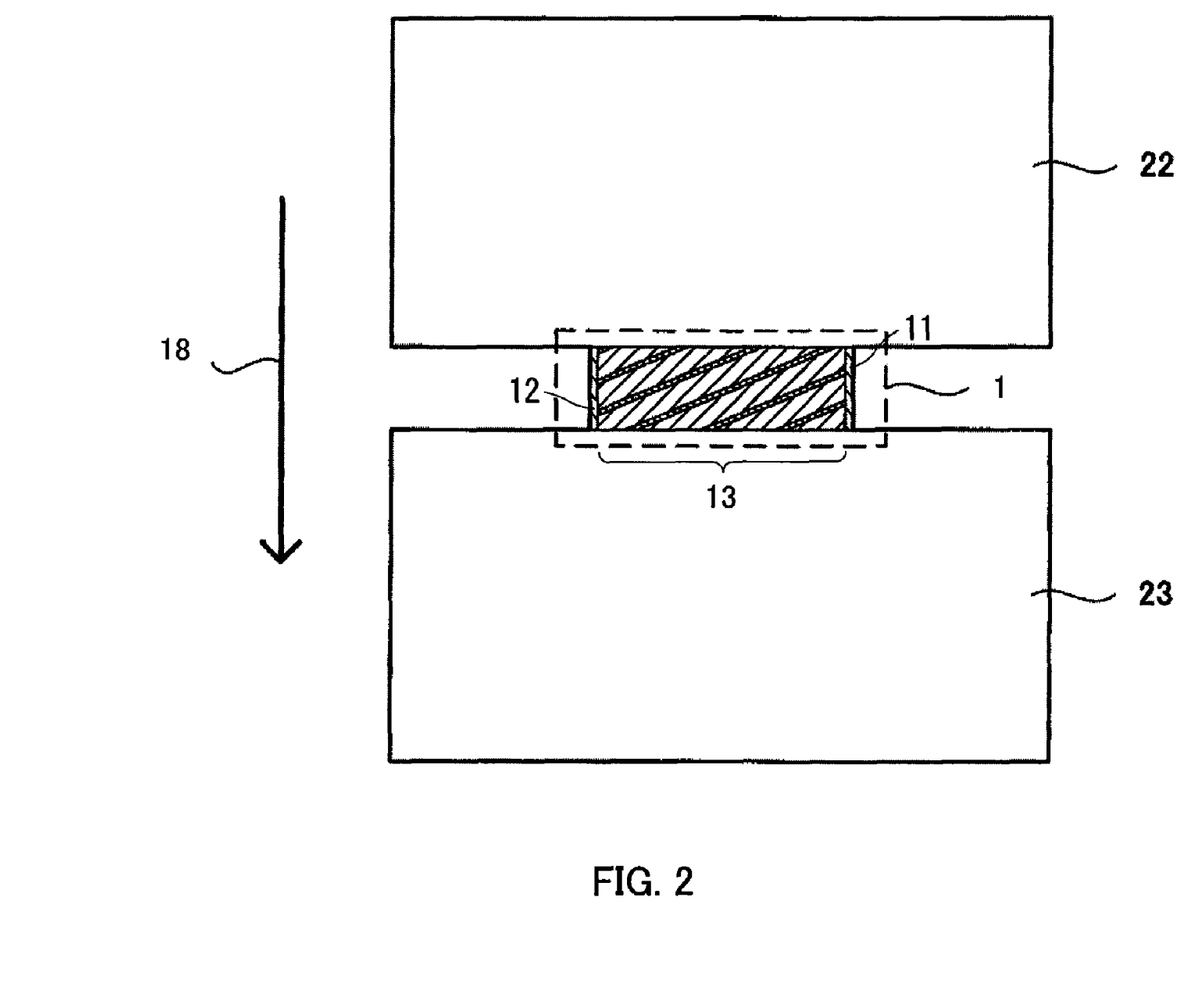
FIG. 2 is a diagram that schematically shows an example of an arrangement for driving an example of a thermoelectric element of the present invention.

Specifically, as shown in FIG. 2 for example, a high-temperature body 22 and a low-temperature body 23 are attached closely to the laminate 13 of the thermoelectric element 1, the former being in contact with one of the surfaces on which the electrodes 11 and 12 are not provided, and the latter in contact with the other surface. This creates a temperature difference along direction 18 perpendicular to the opposing direction 17 of the first and second electrodes 11 and 12 and thereby generates a potential difference between the first and second electrodes 11 and 12, making it possible to extract power via the first and second electrodes 11 and 12. In contrast, in conventional thermoelectric elements having the π-type structure, an electromotive force occurs only in a direction parallel to, not perpendicular to, the direction along which a temperature difference is created. Therefore, conventional thermoelectric elements require a temperature difference between the pair of electrodes where power is extracted. It should be noted that the opposing direction 17 of the first electrode 11 and the second electrode 12 in the thermoelectric element 1, and the direction 18 along which a temperature difference is created both traverse the layer surfaces of each layer of the laminate 13. The direction 18 along which a temperature difference is created may be substantially perpendicular to the opposing direction 17 of the first and second electrodes 11 and 12. (Similarly, the term "perpendicular" as used herein may mean "substantially perpendicular".)

As disclosed in Reference 2, it has been difficult conventionally to increase the power factor of the thermoelectric element by improving both Seebeck coefficient S and electrical resistivity ρ of the element. On the other hand, the thermoelectric element 1 can increase power factor and provide improved thermoelectric properties as compared with the case where a Bi material as represented by $Bi_2Te_3$ is solely used as the thermoelectric material.

The metal layer 15 is made of a metal other than Bi, and preferably includes a metal with high thermal conductivity κ and small electrical resistivity ρ. For example, the metal layer 15 may include Al, Cu, Ag, or Au. When the metal layer 15 contains Cu, Ag, or Au, and particularly Cu or Ag, even more improved thermoelectric properties can be obtained. Note that, the metal layer 15 may include these metals either individually or as an alloy.

It is preferable that the first electrode 11 and the second electrode 12 be made of material with good conductivity. Examples of such materials include metals such as Cu, Ag, Mo, W, Al, Ti, Cr, Au, Pt, and In, or nitrides or oxides such as TiN, indium tin oxide (ITO), and $SnO_2$. Other than these examples, solders and conductive pastes may be used as the electrodes.

Though details will be described later in Examples, the inventors of the present invention through examination of various conditions found that the power factor of the thermoelectric element 1 could be further improved and even more improved thermoelectric properties could be obtained depending on the slant angle θ made by the layer surfaces of each layer of the laminate 13 and the opposing direction 17 of the first and second electrodes 11 and 12, and the thickness ratio of the Bi layer 14 and the metal layer 15.

The slant angle θ is preferably 20° or more to 60° or less, and more preferably 20° or more to 50° or less.

The thickness ratio of the metal layer 15 and the Bi layer 14 is preferably in a range of metal layer:Bi layer=40:1 to 5:1, and more preferably metal layer:Bi layer=20:1 to 10:1.

From the standpoint of a combination of the type of metal layer 15 and the thickness ratio, it is preferable that the metal layer 15 include Al, Cu, Ag, or Au, and the thickness ratio of the metal layer 15 and the Bi layer 14 be in a range of metal layer:Bi layer=40:1 to 5:1, and it is more preferable that the metal layer 15 include Cu or Ag, and the thickness ratio of the metal layer 15 and the Bi layer 14 be in a range of metal layer:Bi layer=20:1 to 10:1.

Depending on such conditions, the power factor (output factor) of the thermoelectric element 1 can be increased to 70 ($\mu W/(cm \cdot K^2)$) or more, or even 80 ($\mu W/(cm \cdot K^2)$) or more, 85 ($\mu W/(cm \cdot K^2)$) or more, or 100 ($\mu W/(cm \cdot K^2)$) or more.

(Fabrication Method of Thermoelectric Element)

Figure 3:
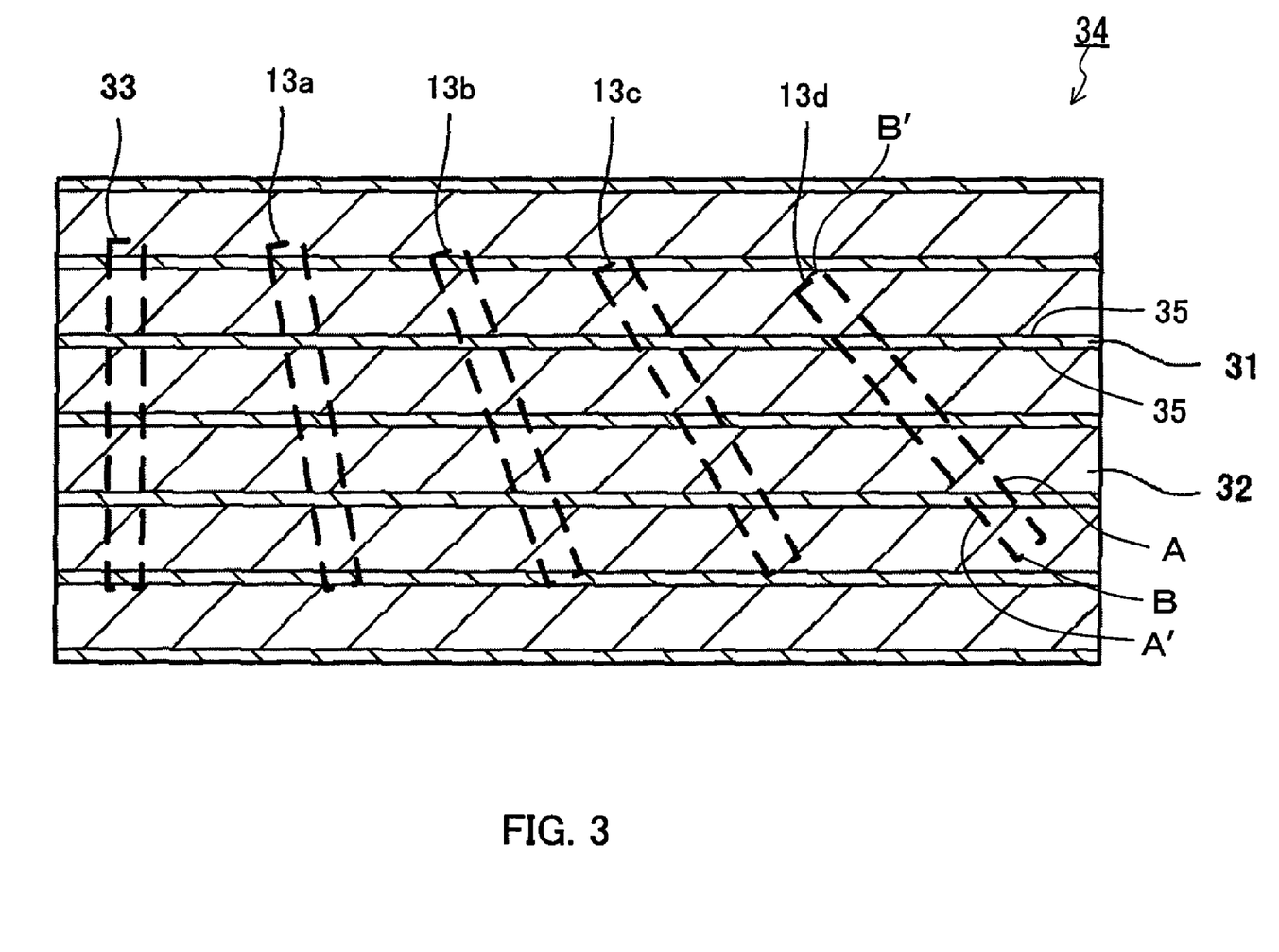
FIG. 3 is a diagram that schematically shows an example of a method for cutting out a laminate from an original plate according to a method of the present invention for fabricating a thermoelectric element.

The thermoelectric element 1 can be made from, for example, an original plate (layered original plate) 34 having, as shown in FIG. 3, an alternately layered structure of a Bi foil 31 and a metal foil 32 made of a metal other than Bi, by cutting the original plate 34 in directions obliquely traversing layer surfaces 35 of the Bi foil 31 and the metal foil 32, and providing first and second electrodes with the resulting laminate (13a, 13b, 13c, or 13d) such that the first and second electrodes oppose each other in a direction traversing the layer surfaces 35. Note that indicated by numeral 33 is a laminate 33 that is obtained by cutting the original plate 34 in a direction perpendicularly traversing the layer surfaces 35, and as such it cannot be used to make a thermoelectric element of the present invention. As used herein, "providing first and second electrodes such that the first and second electrodes oppose each other in a direction traversing the layer surfaces 35" means, for example, that the first and second electrodes are respectively disposed on side surfaces A and A', or B and B', of the laminate 13d shown in FIG. 3.

The original plate 34 can be formed, for example, by the compression bonding of the Bi foil 31 and the metal foil 32 that have been alternately layered together. Compression bonding may accompany application of heat. When the Bi foil 31 is thin, the foil is easily broken due to weak mechanical strength. In this case, it is preferable to provide a metal foil having a Bi film formed thereon in advance and use this metal foil for compression bonding. This can lead the reduction of defects in the original plate 34. Here, only one side of the metal foil may be provided with the Bi film. However, by providing the metal foil with the Bi film on the both surfaces, adhesion between the constituting layers of the original plate 34 can be improved.

The original plate 34 can also be formed, for example, by alternately depositing a Bi thin film and a metal thin film made of a metal other than Bi. The thin films can be deposited by various types of thin film forming methods, including, for example, vapor-phase growth methods such as a sputtering method, a vapor deposition method, a laser ablation method, and a chemical vapor-phase growth method. Liquid-phase growth methods may be used as well.

The original plate 34 may be cut by known techniques such as machining. As required, the surfaces of the laminate 13 may be ground after it has been cut out.

When providing the first and second electrodes, it is not necessarily required to dispose the electrode over the entire surface of the laminate 13 where the electrode should be provided. Instead, the electrode may be disposed only in a portion of the surface where the laminate 13 should be provided with the electrode.

The method of providing the first and second electrodes is not particularly limited. For example, the electrodes may be formed by various types of thin film forming techniques such as a sputtering method, a vapor deposition method, and a vapor-phase growth method, or by application of a conductive paste, plating, or thermal spraying. Alternatively, electrodes that have been formed separately may be bonded to the laminate 13 with a solder.

The thermoelectric element 1 may also be fabricated by methods other than the foregoing method. For example, an etching mask with periodically formed openings is placed on a surface of a metal plate made of a metal other than Bi, and the surface of the metal plate is obliquely irradiated by highly linear etching particles to form equally spaced slits that are slanted with respect to the metal surface in a cross section. Then, Bi is deposited inside the slits (for example, a Bi vapor is sucked into the slits under applied pressure) to form the laminate 13. The laminate 13 can then be provided with the first and second electrodes as above to form the thermoelectric element 1.

(Thermoelectric Device)

Figure 4:
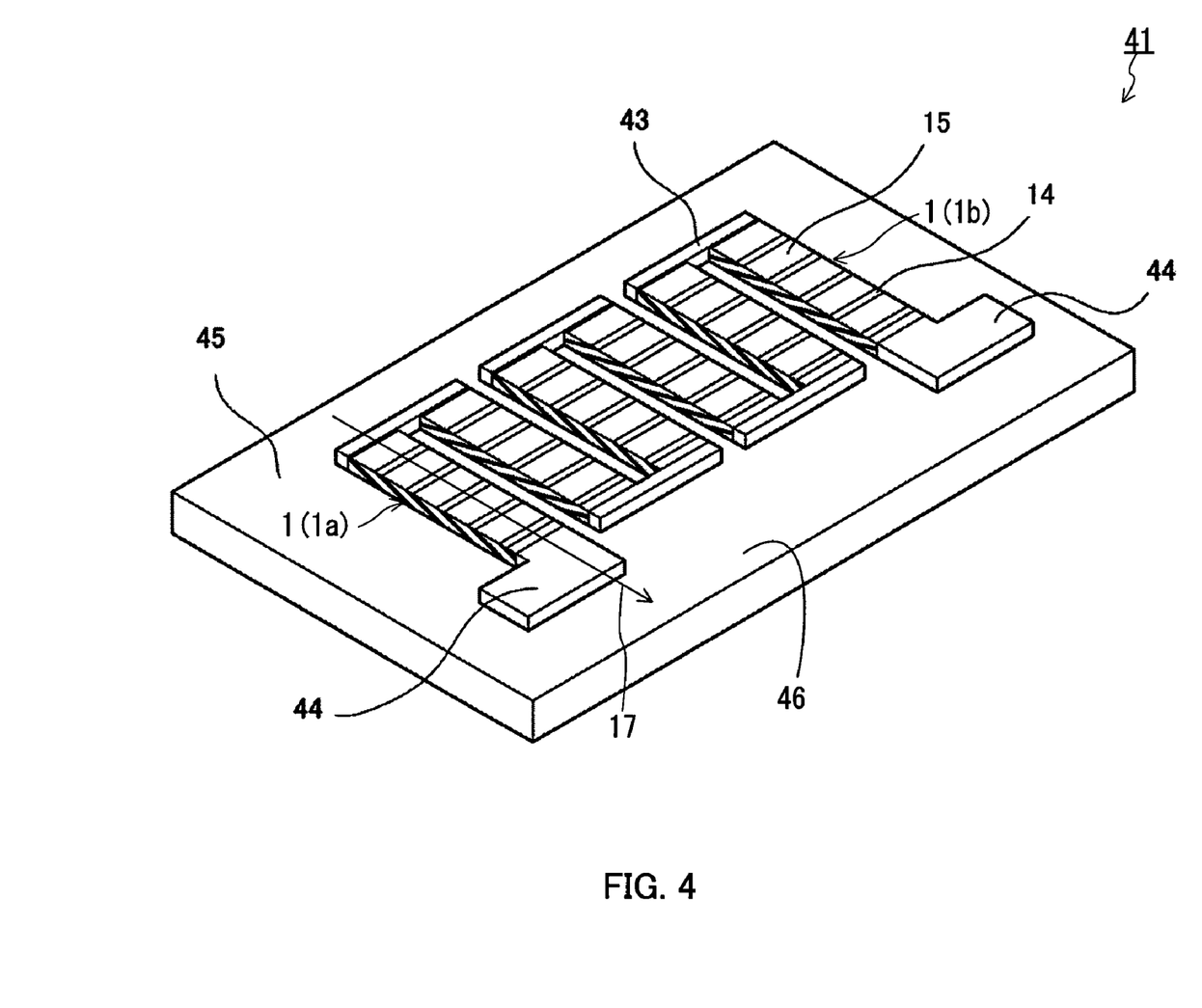
FIG. 4 is a perspective view that schematically shows an example of a thermoelectric device of the present invention.

FIG. 4 illustrates an example of a thermoelectric device of the present invention. The thermoelectric device 41 shown in FIG. 4 includes a support plate 45, and six thermoelectric elements 1 of the present invention disposed on the support plate 45. Each element 1 is disposed on the support plate 45 such that the direction perpendicular to the direction 17 in which the first and second electrodes oppose each other in each element coincides with a direction perpendicular to a surface 46 of the support plate 45 on which the elements 1 are disposed. The elements 1 adjacent to each other are electrically connected to each other in series via an interconnecting electrode 43 that serves as the first or second electrode of each element 1. Elements 1a and 1b at the terminals of the series of six thermoelectric elements 1 are each provided with an extracting electrode 44 that serves as the first or second electrode.

In the thermoelectric device 41, power can be obtained via the extracting electrodes 44 by creating a temperature difference along a direction perpendicular to the surface 46 of the support plate 45. A temperature difference can be created, for example, by providing a low-temperature body in contact with the surface of the support plate 45 not provided with the thermoelectric elements 1, and a high-temperature body in contact with the surface of the elements 1 opposite the surface in contact with the support plate 45. Note that, between adjacent elements 1 of the example shown in FIG. 4, the layer surfaces of the Bi layer and the metal layer are slanted in opposite directions. This is to prevent the electromotive force occurring in each element 1 by the temperature difference from being cancelled out between adjacent elements 1.

Figure 5:
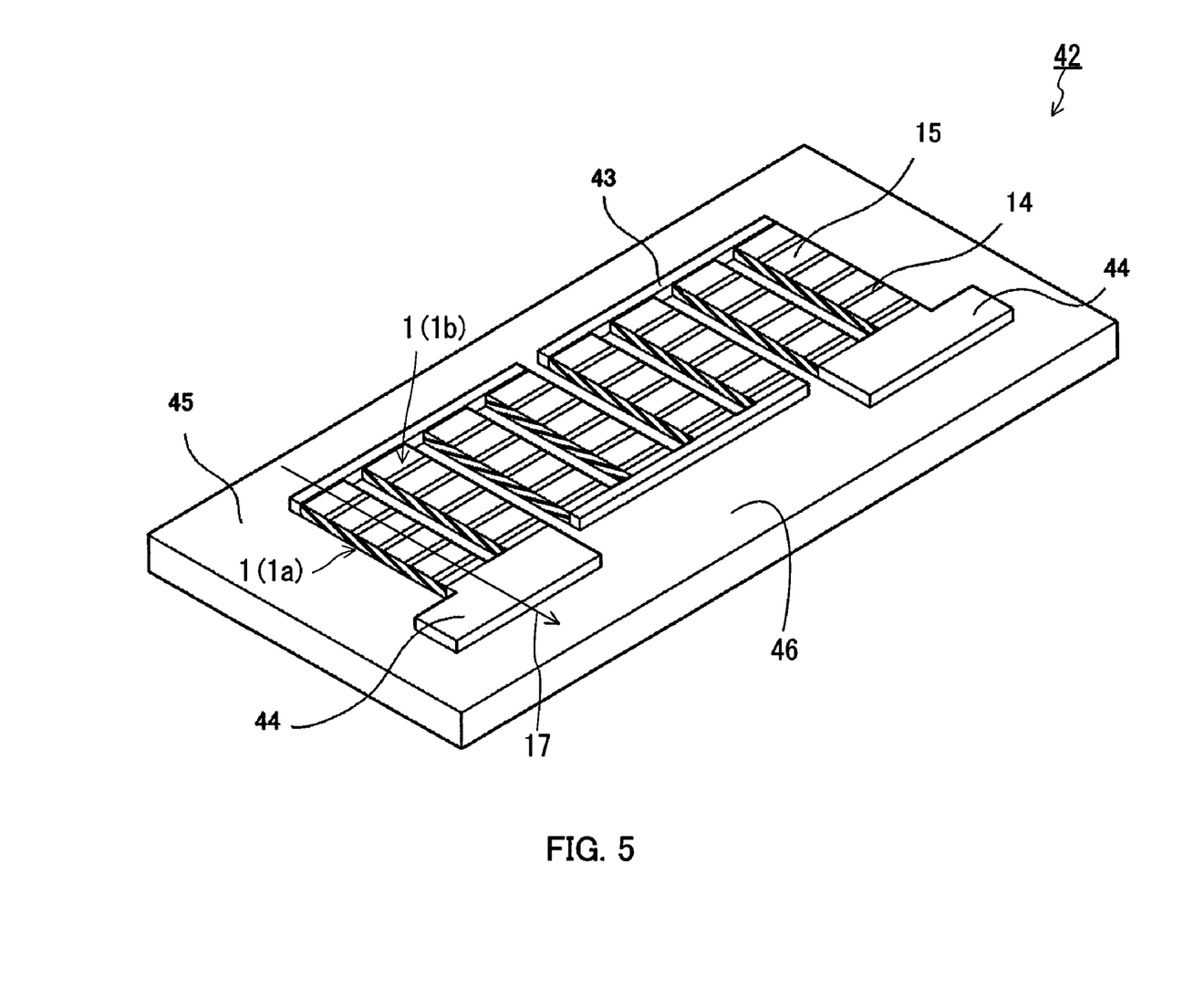
FIG. 5 is a perspective view that schematically shows another example of a thermoelectric device of the present invention.

FIG. 5 illustrates another example of a thermoelectric device of the present invention. The thermoelectric device 42 shown in FIG. 5 includes a support plate 45, and eight thermoelectric elements 1 of the present invention disposed on the support plate 45. Each element 1 is disposed on the support plate 45 such that the direction perpendicular to the direction 17 in which the first and second electrodes oppose each other in each element coincides with a direction perpendicular to a surface 46 of the support plate 45 on which the elements 1 are disposed. The eight elements 1 are disposed in four blocks on the support plate 45, each block being made up of two elements 1. The elements in each block (for example, elements 1a and 1b) are electrically connected to each other in parallel via the interconnecting electrode 43 that serves as the first or second electrode of each element. Adjacent blocks are electrically connected to each other in series via the interconnecting electrode 43.

In the thermoelectric device 42, power can be obtained via the extracting electrodes 44 by creating a temperature difference along a direction perpendicular to the surface 46 of the support plate 45. A temperature difference can be created, for example, by providing a low-temperature body in contact with the surface of the support plate 45 not provided with the elements 1, and a high-temperature body in contact with the surface of the elements 1 opposite the surface in contact with the support plate 45. Note that, between the elements 1 in each block of the example shown in FIG. 5, the Bi layer and the metal layer are slanted in the same direction, whereas the Bi layer and the metal layer are slanted in opposite directions between the elements 1 of adjacent blocks. This is to prevent the electromotive force occurring in each element 1 (or block) by the temperature difference from being cancelled out between adjacent elements and adjacent blocks.

The structure of a thermoelectric device of the present invention is not limited to the examples shown in FIG. 4 and FIG. 5. For example, only one thermoelectric element may be provided on the support plate. However, with the thermoelectric device provided with two or more thermoelectric elements as in the examples shown in FIG. 4 and FIG. 5, an increased amount of power can be obtained therefrom. Further, an increased voltage can be obtained by electrically connecting the elements in series as in the example shown in FIG. 4. Further, by electrically connecting the elements in parallel as in the example shown in FIG. 5, the function of the thermoelectric device as a whole is more likely remain even when the electrical connection of the elements 1 is partially lost. This improves reliability of the thermoelectric device. That is, through suitable combinations of serial and parallel connections, the thermoelectric device can be structured to provide improved thermoelectric properties.

The structures of the interconnecting electrode 43 and the extracting electrode 44 are not particularly limited as long as they provide good conductivity. For example, the interconnecting electrode 43 and the extracting electrode 44 may be made of metals such as Cu, Ag, Mo, W, Al, Ti, Cr, Au, Pt, and In, or nitrides or oxides such as TiN, indium tin oxide (ITO), and SnO$_2$. Other than these examples, solders and conductive pastes may be used as the electrodes.

(Power Generation Method using Thermoelectric Element)

A power generation method of the present invention is a method for obtaining power via the first electrode 11 and the second electrode 12 (or the interconnecting electrode 43 or extracting electrode 44) by creating a temperature difference along a direction perpendicular to the opposing direction 17 of the electrodes of the thermoelectric element 1 of the present invention described above.

EXAMPLES

The following will describe the present invention in more detail. The present invention is not limited to the Examples described below.

Example 1

In Example 1, Bi and several kinds of metals (Au, Ag, Cu, or Al) were used to prepare a thermoelectric element 1 as shown in FIG. 1, and thermoelectric properties of the element were evaluated.

First, a Bi thin film having a thickness of 2.5 μm was formed by a sputtering method on the both surfaces of a metal foil (Au foil, Ag foil, Cu foil, or Al foil) having a size of 100 mm×100 mm and a thickness of 95 μm. A resulting sheet of Bi film/metal foil/Bi film was cut into small strips each having a size of 5 mm×50 mm, and 200 sheets of these strips were laminated and were subjected to compression bonding with applied heat at 250° C. for 1 hour, under a reduced pressure of 10$^{-4}$ Pa and a load of 100 kg/cm$^2$ applied in the direction the strips were laminated. This was followed by cutting and grinding to obtain a layered original plate having a size of 3 mm×48 mm and a thickness of 20 mm. Observation of a cross section of the original plate with a scanning electron microscope (SEM) confirmed that a metal layer having a thickness of about 95 μm and a Bi layer having a thickness of about 5 μm were alternately layered. The thickness ratio of metal layer and Bi layer in the original plate is approximately metal layer:Bi layer=19:1.

Using a diamond cutter, the original plate was machined to cut out laminates 13 each having a thickness of 1 mm, a width of 3 mm, and a length of 20 mm, by varying the slant angle θ in 10° increment from 0° to 90° as shown in FIG. 3. Then, the first electrode 11 and the second electrode 12, both made of Au, were formed by a sputtering method respectively on the surfaces of each laminate 13 at the both ends of the longer side thereof (corresponding to the surfaces B and B' in FIG. 3) to obtain a thermoelectric element 1 as shown in FIG. 1.

Next, as shown in FIG. 2, a surface of the element 1 not provided with the electrodes was heated to 150° C. with a heater while maintaining the temperature of the opposite surface at 30° C., so as to create a temperature gradient along a direction perpendicular to the direction 17. A resulting voltage generated between the electrodes and an electrical resistivity therebetween were measured to determine a power factor of the element 1. Note that, the temperature gradient was created along the direction traversing the layer surfaces of the Bi layer and the metal layer of the laminate 13.

Table 1 below represents results of evaluation of power factor of the element 1 at varying slant angles θ, using different metal layers (Au layer, Ag layer, Cu layer, Al layer) for the element 1. As an example, the element 1 with the metal layer made of Ag and a slant angle θ of 30° had an electrical resistivity of 0.23 mΩ and generated a voltage of 59 mV. The power factor of the element determined from these values was 175 (μW/(cm·K$^2$)).

TABLE 1

Changes in power factor (μW/(cm · K$^2$)) of the element according to slant angle θ(°)

| Slant angle θ(°) | 0 | 10 | 20 | 30 | 40 | 50 | 60 | 70 | 80 | 90 |
|---|---|---|---|---|---|---|---|---|---|---|
| Au | 0 | 25 | 80 | 120 | 128 | 105 | 70 | 35 | 5 | 0 |
| Ag | 0 | 40 | 125 | 175 | 170 | 140 | 85 | 42 | 8 | 0 |
| Cu | 0 | 38 | 118 | 168 | 165 | 130 | 85 | 38 | 6 | 0 |
| Al | 0 | 14 | 40 | 75 | 80 | 68 | 45 | 20 | 5 | 0 |

As shown in Table 1, the power factor was nil in elements with the slant angle θ of 0° and 90°. In other words, the power factor was nil in elements in which the layer surfaces of the Bi layer and the metal layer were parallel or orthogonal to the opposing direction of the first and second electrodes. On the other hand, the power factor had values in elements with the slant angles θ other than 0° and 90°. In other words, the power factor had values in elements in which the layer surfaces of the Bi layer and the metal layer were slanted with respect to the opposing direction of the first and second electrodes.

Large power factors of 40 (μW/(cm·K$^2$)) or more were obtained at slant angles θ from 20° to 60°. Particularly large power factors were obtained when Au, Ag, or Cu was used for the metal layer (power factor of 70 μW/(cm·K$^2$) or more), and Ag or Cu for the metal layer (power factor of 85 μW/(cm·K$^2$) or more).

The power factor was particularly large at slant angles from 20° to 50°. This was notable when Ag or Cu was used for the metal layer.

These values of power factor are at least about twice as large as the values of power factor of the thermoelectric elements currently used in practical applications with the thermoelectric material Bi$_2$Te$_3$.

Example 2

According to the procedure of Example 1, elements with different thickness ratios of metal layer and Bi layer were prepared using Ag or Cu for the metal layer. Elements were prepared with the slant angle θ fixed at 30°, and by varying the thickness of the metal foil used for preparation at 70 μm, 80 μm, 90 μm, 95 μm, 98 μm, and 99 μm so that the periodically occurring metal-Bi layer had a thickness of 100 μm. Accordingly, the proportions in thickness of the Bi layer in the laminate of the resulting element were 30%, 20%, 10%, 5%, 2%, and 1%, respectively.

Table 2 below represents results of evaluation of power factor of the elements. The evaluation was carried out in the same manner as in Example 1.

TABLE 2

Changes in power factor (μW/(cm · K$^2$)) of the element according to thickness proportion of Bi layer in the laminate

| | Proportion in thickness of Bi layer in laminate (%) | | | | | |
|---|---|---|---|---|---|---|
| | 30 | 20 | 10 | 5 | 2 | 1 |
| Ag | 80 | 110 | 158 | 175 | 116 | 50 |
| Cu | 80 | 105 | 155 | 168 | 110 | 40 |

As shown in Table 2, large power factors were obtained when the proportion in thickness of the Bi layer in the laminate was 2% to 20%, and particularly 5% to 10%. The power factor was the greatest when the proportion was 5%. The same pattern was observed whether Ag or Cu was used for the metal layer.

Example 3

According to the procedure of Example 1, elements were prepared by varying the slant angle θ and the thickness ratio of metal layer and Bi layer, using Cu for the metal layer. The slant angle θ was varied in 5° increment from 20° to 50°. The thickness of the Cu foil used for preparation was fixed at 20 μm, and the thickness of the Bi thin film formed on the surfaces of the Cu foil was varied at 0.25 μm, 0.5 m, 1 μm, 2 μm, 4 μm, and 8 μm.

Table 3 below represents results of evaluation of power factor of the elements. The evaluation was carried out in the same manner as in Example 1.

TABLE 3

Changes in power factor ($\mu W/(cm \cdot K^2)$) of the element according to slant angle θ and thickness proportion of Bi layer in the laminate--Cu was used for the metal layer

| Slant angle θ(°) | | 20 | 25 | 30 | 35 | 40 | 45 | 50 |
|---|---|---|---|---|---|---|---|---|
| Thickness of Bi layer in forming laminate (μm)/proportion in thickness of Bi layer in laminate (%) | 8(μm)/29(%) | 78 | 82 | 84 | 80 | 72 | 60 | 48 |
| | 4(μm)/17(%) | 100 | 115 | 118 | 112 | 108 | 92 | 78 |
| | 2(μm)/9(%) | 118 | 140 | 152 | 148 | 146 | 130 | 110 |
| | 1(μm)/5(%) | 105 | 140 | 160 | 162 | 158 | 148 | 130 |
| | 0.5(μm)/2(%) | 70 | 98 | 114 | 125 | 125 | 120 | 110 |
| | 0.25(μm)/1(%) | 38 | 50 | 66 | 78 | 75 | 70 | 42 |

As shown in Table 3, at slant angles θ of 20° to 50°, large power factors of 70 $\mu W/(cm \cdot K^2)$ or more were obtained when the Bi thin film had a thickness in a range of 0.5 μm to 4 μm. This indicates that large power factors can be obtained when the thickness ratio of Cu layer and Bi layer in the element (or in the periodic Cu—Bi layer of the element) is Cu layer:Bi layer=40:1 to 5:1. A particularly large power factor exceeding as high as 160 $\mu W/(cm \cdot K^2)$ was obtained when the ratio was 20:1 (when the thickness proportion of the Bi layer in the laminate was 5%).

Considering this result with the result of Example 2, it can be envisaged that the thermoelectric properties of the element are more dependent on the thickness ratio of metal layer and Bi layer than the absolute values of the thicknesses of these layers. As for the slant angle θ, large power factors of 150 $\mu W/(cm \cdot K^2)$ or more were obtained in a range of 30° to 40° (20:1 in thickness ratio). As a result, a high-performance thermoelectric element was realized that had a power factor at least about three times as large as that of the thermoelectric elements currently used in practical applications with the thermoelectric material $Bi_2Te_3$.

Example 4

In Example 4, a thermoelectric device 41 as shown in FIG. 4 was prepared, in order to increase the mount area of the element and the amount of thermoelectric power obtained. In the element 1, Cu was used for the metal layer. Cu was also used for the interconnecting electrode 43 and the extracting electrode 44.

As the support plate 45, an alumina plate was used. The element 1 to be provided on the alumina plate was prepared in the same manner as in Example 1. In the element 1, the Cu layer and the Bi layer had thicknesses of 20 μm and 1 μm, respectively (i.e., the thickness ratio of Cu layer and Bi layer was Cu layer:Bi layer=20:1), and the slant angle θ was 35°. The laminate 13 in the element 1 had a size of 50 mm in length, 3 mm in width, and 0.5 mm in thickness.

Fifteen elements 1 were prepared. The elements 1 were arranged on the support 45 at 1-mm intervals, and adjacent elements 1 were electrically connected to each other in series via the interconnecting electrode 43, as shown in FIG. 4. Here, the elements 1 were arranged such that the slant directions of the Bi layers were directed in opposite directions between adjacent elements 1, in order to prevent cancellation of the electromotive force of each element 1 arising from the temperature difference. The fifteen elements 1 were disposed in an area of about 60 mm×60 mm.

The electrical resistivity between the extracting electrodes 44 of the thermoelectric device 41 so prepared had a measured value of 0.02Ω.

Next, the rear surface of the support plate 46 (the surface opposite the surface provided with the elements 1) was liquid-cooled and maintained at a temperature of 25° C., and the surface of each element 1 opposite the surface in contact with the support plate 46 was maintained at 40° C. using a ceramic heater in closely contact with this surface of the element 1. As a result, an open-end voltage of 0.56 V was obtained between the extracting electrodes 44. From this value and the measured electrical resistivity, the power factor of the thermoelectric device 41 was estimated to be 155 $\mu W/(cm \cdot K^2)$, which allowed the power as large as 3.8 W to be extracted.

As described above, the present invention realizes superior thermoelectric properties over power generation methods, thermoelectric elements, and thermoelectric devices using conventional thermoelectric material as represented by $BiTe_3$. The present invention improves the efficiency of energy conversion between thermal energy and electric energy, and thereby promotes application of thermoelectric generation in a wide range of fields. The invention is therefore industrially highly useful.

Examples of prospective applications include generators using the heat of emission gas from automobiles and plants, and small portable generators.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A power generation method using a thermoelectric element, in which power is obtained from the thermoelectric element by creating a temperature difference in the element, the element comprising:
  a first electrode and a second electrode that are disposed to oppose each other; and
  a laminate interposed between the first electrode and the second electrode and electrically connected to both of the first and second electrodes,
  the laminate having a structure in which a Bi layer and a metal layer made of a metal other than Bi are alternately layered, and
  the Bi layer and the metal layer having layer surfaces that are slanted with respect to a direction in which the first electrode and the second electrode oppose each other,
  the method comprising creating a temperature difference along a direction perpendicular to the opposing direction of the first and second electrodes in the element, so as to obtain power via the first electrode and the second electrode.

2. The power generation method using a thermoelectric element according to claim 1, wherein the layer surfaces are slanted with respect to the opposing direction at a slant angle θ of 20° or more to 60° or less.

3. The power generation method using a thermoelectric element according to claim 1, wherein the layer surfaces are slanted with respect to the opposing direction at a slant angle θ of 20° or more to 50° or less.

4. The power generation method using a thermoelectric element according to claim 1, wherein the metal layer includes Al, Cu, Ag, or Au.

5. The power generation method using a thermoelectric element according to claim 1, wherein the metal layer includes Cu, Ag, or Au.

6. The power generation method using a thermoelectric element according to claim 1, wherein the metal layer includes Cu or Ag.

7. The power generation method using a thermoelectric element according to claim 1, wherein a thickness ratio of the metal layer and the Bi layer falls within a range of metal layer:Bi layer=40:1 to 5:1.

8. The power generation method using a thermoelectric element according to claim 1, wherein a thickness ratio of the metal layer and the Bi layer falls within a range of metal layer:Bi layer=20:1 to 10:1.

9. The power generation method using a thermoelectric element according to claim 1, wherein the element has a power factor of 70 ($\mu$W/(cm·K$^2$)) or more.

10. The power generation method using a thermoelectric element according to claim 2, wherein:
  the metal layer includes Al, Cu, Ag, or Au; and
  a thickness ratio of the metal layer and the Bi layer falls within a range of metal layer:Bi layer=40:1 to 5:1.

11. The power generation method using a thermoelectric element according to claim 3, wherein:
  the metal layer includes Cu or Ag; and
  a thickness ratio of the metal layer and the Bi layer falls within a range of metal layer:Bi layer=20:1 to 10:1.

12. The power generation method using a thermoelectric element according to claim 11, wherein the element has a power factor of 70 ($\mu$W/(cm·K$^2$)) or more.

13. A thermoelectric element comprising:
  a first electrode and a second electrode that are disposed to oppose each other; and
  a laminate interposed between the first electrode and the second electrode and electrically connected to both of the first and second electrodes,
  the laminate having a structure in which a Bi layer and a metal layer made of a metal other than Bi are alternately layered, and
  the Bi layer and the metal layer having layer surfaces that are slanted with respect to a direction in which the first electrode and the second electrode oppose each other,
  the element generating a potential difference between the first electrode and the second electrode by a temperature difference created along a direction perpendicular to the opposing direction of the first and second electrodes in the element.

14. The thermoelectric element according to claim 13, wherein the layer surfaces are slanted with respect to the opposing direction at a slant angle θ of 20° or more to 60° or less.

15. The thermoelectric element according to claim 13, wherein the layer surfaces are slanted with respect to the opposing direction at a slant angle θ of 20° or more to 50° or less.

16. The thermoelectric element according to claim 13, wherein the metal layer includes Al, Cu, Ag, or Au.

17. The thermoelectric element according to claim 13, wherein the metal layer includes Cu, Ag, or Au.

18. The thermoelectric element according to claim 13, wherein the metal layer includes Cu or Ag.

19. The thermoelectric element according to claim 13, wherein a thickness ratio of the metal layer and the Bi layer falls within a range of metal layer:Bi layer=40:1 to 5:1.

20. The thermoelectric element according to claim 13, wherein a thickness ratio of the metal layer and the Bi layer falls within a range of metal layer:Bi layer=20:1 to 10:1.

21. The thermoelectric element according to claim 13, wherein the element has a power factor of 70 ($\mu$W/(cm·K$^2$)) or more.

22. The thermoelectric element according to claim 14, wherein:
  the metal layer includes Al, Cu, Ag, or Au; and
  a thickness ratio of the metal layer and the Bi layer falls within a range of metal layer:Bi layer=40:1 to 5:1.

23. The thermoelectric element according to claim 15, wherein:
  the metal layer includes Cu or Ag; and
  a thickness ratio of the metal layer and the Bi layer falls within a range of metal layer:Bi layer=20:1 to 10:1.

24. The thermoelectric element according to claim 23, wherein the element has a power factor of 70 ($\mu$W/(cm·K$^2$)) or more.

25. A fabrication method of a thermoelectric element which comprises:
  a first electrode and a second electrode that are disposed to oppose each other; and
  a laminate interposed between the first electrode and the second electrode and electrically connected to both of the first and second electrodes,
  the laminate having a structure in which a Bi layer and a metal layer made of a metal other than Bi are alternately layered, and
  the Bi layer and the metal layer having layer surfaces that are slanted with respect to a direction in which the first electrode and the second electrode oppose each other,
  the element generating a potential difference between the first electrode and the second electrode by a temperature difference created along a direction perpendicular to the opposing direction of the first and second electrodes in the element, the method comprising: cutting an original plate in which the Bi layer and the metal layer made of a metal other than Bi are alternately layered, such that the original plate is cut by obliquely traversing the layer surfaces of the Bi layer and the metal layer; and providing a resulting laminate with the first electrode and the second electrode such that the first and second electrodes oppose each other, and that the opposing direction of the first and second electrodes traverses the layer surfaces of the Bi layer and the metal layer.

26. A thermoelectric device comprising:

a support plate; and a thermoelectric element disposed on the support plate, the element including a first electrode and a second electrode that are disposed to oppose each other, and a laminate interposed between the first electrode and the second electrode and electrically connected to both of the first and second electrodes, the laminate having a structure in which a Bi layer and a metal layer made of a metal other than Bi are alternately layered, the Bi layer and the metal layer having layer surfaces that are slanted with respect to the opposing direction of a pair of the electrodes, the element being disposed on the support plate such that a direction perpendicular to the opposing direction of the first and second electrodes coincides with a direction perpendicular to a surface of the support plate on which the element is disposed, wherein power can be obtained via the pair of the electrodes by creating a temperature difference along a direction perpendicular to the surface of the support plate.

27. The thermoelectric device according to claim 26, comprising two or more of the elements, wherein the elements are electrically connected to each other in series via the first electrode or the second electrode.

28. The thermoelectric device according to claim 26, comprising two or more of the elements, wherein the elements are electrically connected to each other in parallel via the first electrode or the second electrode.

* * * * *